(12) United States Patent
Zhu et al.

(10) Patent No.: US 7,977,712 B2
(45) Date of Patent: Jul. 12, 2011

(54) ASYMMETRIC SOURCE AND DRAIN FIELD EFFECT STRUCTURE

(75) Inventors: Huilong Zhu, Poughkeepsie, NY (US);
Hong Lin, Mount Kisco, NY (US);
Katherine L. Saenger, Ossining, NY (US); Kai Xiu, Pleasantville, NY (US);
Haizhou Yin, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 533 days.

(21) Appl. No.: 12/059,059

(22) Filed: Mar. 31, 2008

(65) Prior Publication Data
US 2009/0242942 A1 Oct. 1, 2009

(51) Int. Cl.
*H01L 29/04* (2006.01)
(52) U.S. Cl. ................. 257/255; 257/E29.004
(58) Field of Classification Search .......... 257/255, 257/E29.004; 438/271
See application file for complete search history.

(56) References Cited

U.S. PATENT DOCUMENTS

| 6,566,204 | B1 | 5/2003 | Wang et al. | |
| 6,605,845 | B1 | 8/2003 | Liang | |
| 6,670,694 | B2 * | 12/2003 | Momose | 257/627 |
| 2006/0226495 | A1 * | 10/2006 | Kwon | 257/371 |

* cited by examiner

*Primary Examiner* — Kiesha R Bryant
*Assistant Examiner* — Tucker Wright
(74) *Attorney, Agent, or Firm* — Scully, Scott, Murphy & Presser, P.C.; H. Daniel Schnurmann

(57) ABSTRACT

A semiconductor structure, such as a CMOS semiconductor structure, includes a field effect device that includes a plurality of source and drain regions that are asymmetric. Such a source region and drain region asymmetry is induced by fabricating the semiconductor structure using a semiconductor substrate that includes a horizontal plateau region contiguous with and adjoining a sloped incline region. Within the context of a CMOS semiconductor structure, such a semiconductor substrate allows for fabrication of a pFET and an nFET upon different crystallographic orientation semiconductor regions, while one of the pFET and the nFET (i.e., typically the pFET) has asymmetric source and drain regions.

12 Claims, 6 Drawing Sheets

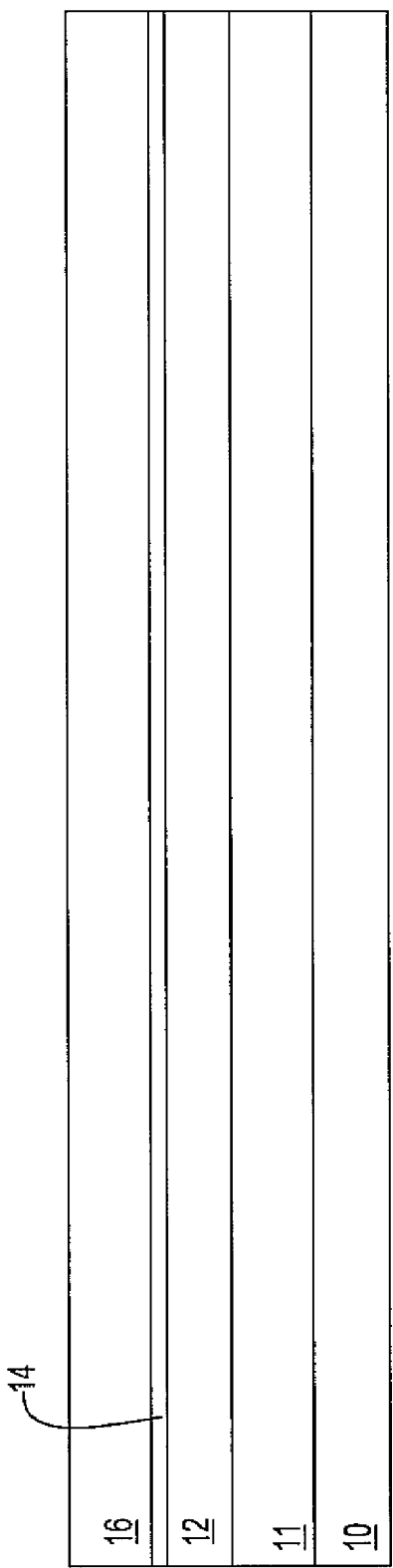
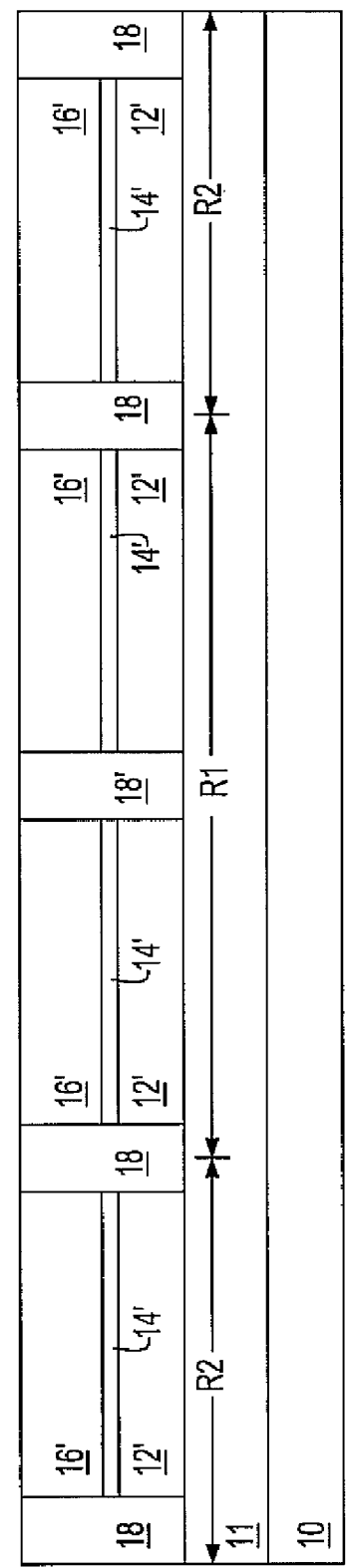

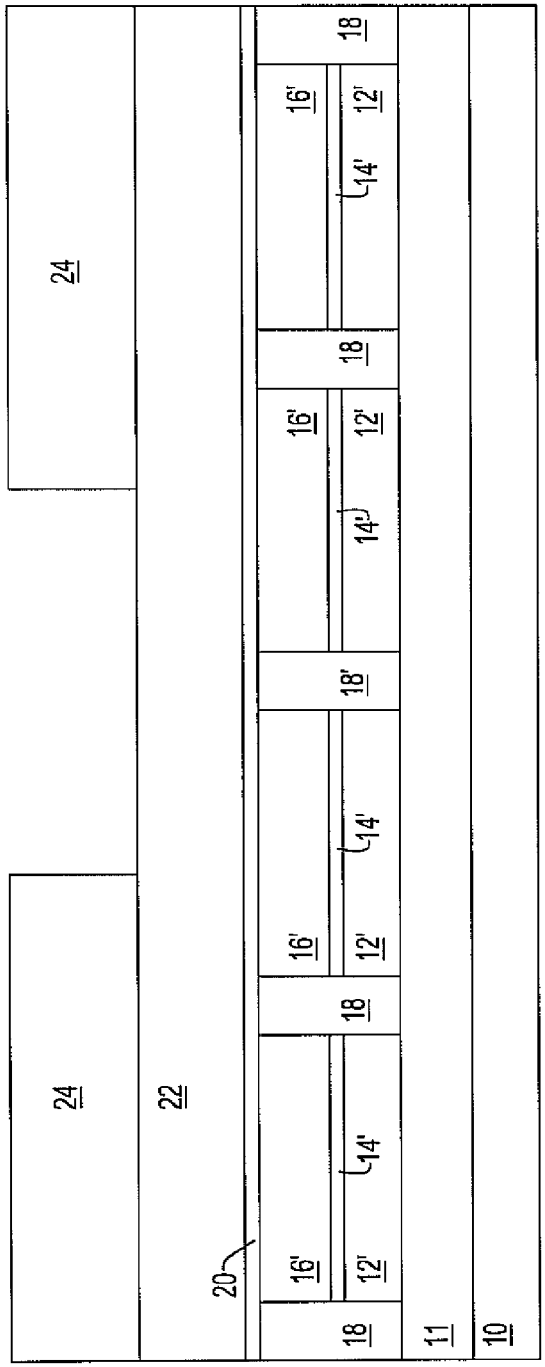

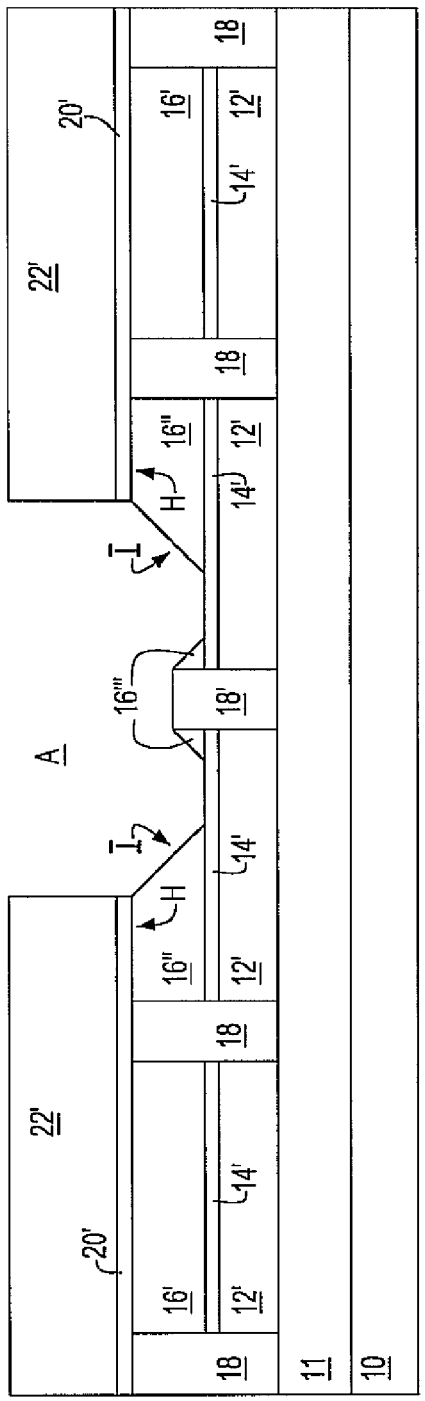

ASYMMETRIC SOURCE AND DRAIN FIELD EFFECT STRUCTURE

BACKGROUND

1. Field of the Invention

The invention relates generally to field effect structures. More particularly, the invention relates to field effect structures with enhanced performance.

2. Description of the Related Art

Field effect structures that include field effect devices, such as field effect transistors, are common semiconductor structures. Such field effect structures have been effectively scaled in dimension for several decades to provide sequentially increased performance and functionality of semiconductor circuits.

As semiconductor structure dimensions and semiconductor device dimensions have continued to decrease, several novel approaches have evolved that supplement semiconductor structure dimensional scaling for providing enhanced semiconductor device performance. Included among such novel approaches are: (1) approaches that exploit intrinsically different properties of different materials of composition of field effect devices; as well as (2) approaches that exploit mechanical effects, such as but not limited to mechanical stress effects, within field effect devices.

While such additional novel approaches to field effect device performance enhancement are thus desirable within semiconductor fabrication art, further additional novel approaches to field effect device performance enhancement are nonetheless also still desirable.

Various semiconductor structures having desirable properties, and methods for fabrication thereof, are known in the semiconductor fabrication art.

For example, Liang, in U.S. Pat. No. 6,605,845, teaches a field effect transistor structure with enhanced electrical performance, and a related method for fabricating the field effect transistor structure with the enhanced electrical performance. To effect the enhanced electrical performance, this particular field effect transistor structure includes a source region and a drain region that are asymmetric.

In addition, Wang, et al., in U.S. Pat. No. 6,566,204, teaches a field effect transistor structure having enhanced electrical performance and a method for fabricating the field effect transistor structure having the enhanced electrical performance. To effect the enhanced electrical performance, this particular field effect transistor structure includes a channel region that includes an asymmetric dopant profile.

Semiconductor device performance requirements and semiconductor circuit functionality requirements are certain to continue to increase as semiconductor technology advances. Since such increased performance and functionality requirements may be difficult to fulfill using only semiconductor device and semiconductor structure dimensional scaling, desirable are additional novel approaches that provide for fulfillment of increased semiconductor device performance requirements and semiconductor circuit functionality requirements.

SUMMARY

The invention includes a semiconductor structure and a method for fabricating the semiconductor structure. The semiconductor structure includes a field effect structure, in particular such as but not limited to a field effect transistor structure, that includes a plurality of source and drain regions (i.e. typically but not necessarily limited to a single source region and a single drain region) that is asymmetric. The field effect structure, when including a field effect transistor structure that may be included within a CMOS structure, is fabricated using a semiconductor substrate that includes an active region that includes: (1) a horizontal plateau having a first crystallographic orientation; and (2) a contiguous and adjoining sloped incline having a second crystallographic orientation different than the first crystallographic orientation. The presence of the horizontal plateau and the sloped incline within the active region facilitate the formation of the plurality of source and drain regions that is asymmetric.

Within the context of a CMOS semiconductor structure, the presence of the horizontal plateau and the sloped incline within the active region, as well as the presence of a horizontal plateau having the first crystallographic orientation within an additional active region, facilitates fabrication of an nFET and a pFET within different crystallographic orientations within different active regions within the CMOS semiconductor structure.

Within the context of a pFET, the presence of a larger asymmetric source region and a smaller asymmetric drain region provides for a reduced source region resistance and a reduced drain region overlap capacitance. Thus, also realized is a reduced depleted region within a smaller asymmetric drain region that may provide for a reduced short channel effect.

By "asymmetric source and drain regions" the invention intends source and drain regions that may have at least one of a geometrically different cross-sectional shape and a geometrically different junction depth. Asymmetry with respect to dopant concentration is also contemplated. Thus, asymmetry within a particular plurality of source and drain regions may be expressed, at minimum, within the context of either shape or a dimensional magnitude of particular source and drain regions. Asymmetry of a plurality of source and drain regions is intended to indicate that at least two of the plurality of source and drain regions is asymmetric within the context of the above described limitations.

In addition, the description that follows is intended to use the terminology "upon" within the context of layers or structures that contact, while also using the terminology "over" for layers and structures that may be aligned, but do not contact.

A particular semiconductor structure in accordance with the invention includes a semiconductor substrate that includes an active region that includes: (1) a horizontal plateau having a first crystallographic orientation; and (2) a contiguous and adjoining sloped incline having a second crystallographic orientation different than the first crystallographic orientation. This particular semiconductor structure also includes a gate electrode located over a channel within the sloped incline. This particular semiconductor structure also includes a plurality of source and drain regions located within the active region and separated by the channel. The plurality of source and drain regions is asymmetric.

Another particular semiconductor structure in accordance with the invention includes a semiconductor substrate that includes: (1) a first active region that includes: (a) a horizontal plateau having a first crystallographic orientation; and (b) a contiguous and adjoining sloped incline having a second crystallographic orientation different than the first crystallographic orientation; and (2) a second active region having a horizontal plateau having the first crystallographic orientation. This particular semiconductor structure also includes a first gate electrode located over a first channel within the sloped incline within the first active region and a second gate electrode located over a second channel within the horizontal plateau within the second active region. This particular semiconductor structure also includes a plurality of first source and drain regions located within the first active region and separated by the first channel. The plurality of first source and drain regions is asymmetric. This particular semiconductor structure also includes a plurality of second source and drain regions located within the second active region and separated by the second channel. The plurality of second source and drain regions is symmetric.

A particular method for fabricating a semiconductor structure in accordance with the invention includes providing a semiconductor substrate that comprises an active region having a horizontal plateau that has a first crystallographic orientation. This particular method also includes etching the active region to form an etched active region having an etched horizontal plateau having the first crystallographic orientation and a contiguous and adjoining sloped incline having a second crystallographic orientation different than the first crystallographic orientation. This particular method also includes forming a gate electrode over the sloped incline to define a channel within the sloped incline beneath the gate electrode. This particular method also includes forming a plurality of source and drain regions within the active region and separated by the channel. The plurality of source and drain regions is asymmetric.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein:

FIG. 1 to FIG. 11 show a series of schematic cross-sectional diagrams illustrating the results of progressive stages in fabricating a CMOS semiconductor structure in accordance with a particular embodiment of the invention.

DESCRIPTION OF THE PREFERRED EMBODIMENT

Figure 7:
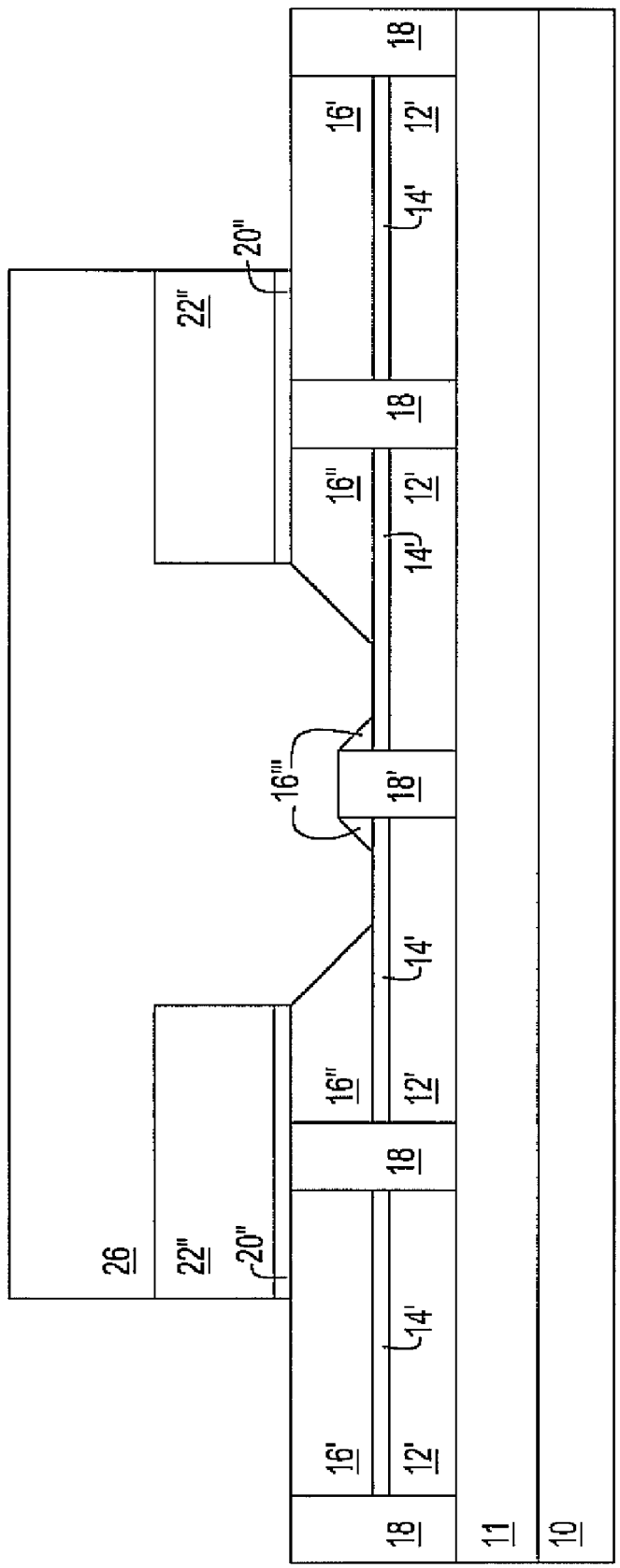

The invention, which includes a semiconductor structure and a method for fabricating the semiconductor structure, is understood within the context of the description that follows. The description that follows is understood within the context of the drawings described above. Since the drawings are intended for illustrative purposes, the drawings are not necessarily drawn to scale.

FIG. 1 to FIG. 11 show a series of schematic cross-sectional diagrams illustrating the results of progressive stages in fabricating a CMOS semiconductor structure in accordance with a particular embodiment of the invention. This particular embodiment of the invention comprises a sole preferred embodiment of the invention. FIG. 1 shows a schematic cross-sectional diagram of the CMOS semiconductor structure at an early stage in the fabrication thereof in accordance with this particular sole preferred embodiment.

FIG. 1 shows a base semiconductor substrate 10. A buried dielectric layer 11 is located upon the base semiconductor substrate 10. An intermediate semiconductor layer 12 is located upon the buried dielectric layer 11. An etch stop semiconductor layer 14 is located upon the intermediate semiconductor layer 12. Finally, a surface semiconductor layer 16 is located upon the etch stop semiconductor layer 14. In an aggregate, the base semiconductor substrate 10, the buried dielectric layer 11, the intermediate semiconductor layer 12, the etch stop semiconductor layer 14 and the surface semiconductor layer 16 comprise a semiconductor-on-insulator substrate.

The base semiconductor substrate 10 may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 10 has a thickness from about 0.2 to about 2 millimeters.

The buried dielectric layer 11 may comprise any of several dielectric materials. Non-limiting examples include oxides, nitrides and oxynitrides, particularly of silicon, but oxides, nitrides and oxynitrides of other elements are not excluded. The buried dielectric layer 11 may comprise a crystalline dielectric material or a non-crystalline dielectric material, with crystalline dielectric materials generally being highly preferred. The buried dielectric layer 11 may be formed using any of several methods. Non-limiting examples include ion implantation methods, thermal or plasma oxidation or nitridation methods, chemical vapor deposition methods and physical vapor deposition methods. Typically, the buried dielectric layer 11 comprises an oxide of the semiconductor material from which is comprised the base semiconductor substrate 10. Typically, the buried dielectric layer 11 has a thickness from about 20 to about 200 nanometers.

The intermediate semiconductor layer 12, the etch stop semiconductor layer 14 and the surface semiconductor layer 16 may comprise any of the several semiconductor materials from which the base semiconductor substrate 10 may be comprised, with the proviso that the etch stop semiconductor layer 14 comprises a semiconductor material that provides etch stop characteristics within the context of a semiconductor material from which is comprised the surface semiconductor layer 16 when etching the surface semiconductor layer 16 in accordance with further disclosure below. Within the context of the foregoing materials of composition limitation with respect to the surface semiconductor layer 16 and the etch stop semiconductor layer 14, each of the individual intermediate semiconductor layer 12, etch stop semiconductor layer 14 and surface semiconductor layer 16 may comprise the same or different semiconductor materials as the base semiconductor substrate 10 with respect to semiconductor materials composition and crystallographic orientation.

From a practical perspective, and while by no means limiting the embodiment or the invention, particularly common semiconductor materials include silicon semiconductor materials and silicon-germanium alloy semiconductor materials. Thus, the base semiconductor substrate 10 may preferably comprise a silicon semiconductor material, along with the intermediate semiconductor layer 12 and the surface semiconductor layer 16. For desirable etch stop properties with respect to the surface semiconductor layer 16, the etch stop semiconductor layer 14 may preferably comprise a silicon-germanium alloy semiconductor material (i.e., preferably from about 5 to about 10 atomic percent, but also up to about 25 atomic percent. Typically, the intermediate semiconductor layer 12 has a thickness from about 5 to about 30 nanometers, the etch stop semiconductor layer 14 has a thickness from about 5 to about 10 nanometers and the surface semiconductor layer 16 has a thickness from about 20 to about 50 nanometers. Typically also, the surface semiconductor layer 16 has a (100) crystallographic orientation, although the embodiment is not so limited.

The semiconductor-on-insulator substrate that is illustrated in FIG. 1 may be fabricated using any of several methods. Non-limiting examples include lamination methods, layer transfer methods and separation by implantation of oxygen (SIMOX) methods.

More particularly, the semiconductor-on-insulator substrate of FIG. 1 may be fabricated by initially starting with a semiconductor-on-insulator substrate that comprises the base semiconductor substrate 10, the buried dielectric layer 11 and the intermediate semiconductor layer 12 as a surface semiconductor layer. The etch stop semiconductor layer 14 may then be epitaxially grown upon the intermediate semiconductor layer 12 and the surface semiconductor layer 16 may then be sequentially epitaxially grown upon the etch stop semiconductor layer 14.

While FIG. 1 illustrates a semiconductor-on-insulator substrate as a starting point for fabricating a CMOS semiconductor structure in accordance with the instant embodiment, this particular embodiment is not intended to be so limited. Rather, the embodiment may also be practiced using a bulk semiconductor substrate. Such a bulk semiconductor substrate would result from absence of the buried dielectric layer 11 within the CMOS semiconductor structure of FIG. 1 and coalescence of the base semiconductor substrate 10 and the intermediate semiconductor layer 12 when the base semiconductor substrate 10 and the intermediate semiconductor layer 12 comprise the same semiconductor material having the same crystallographic orientation.

FIG. 2 shows a plurality of isolation regions 18 located and formed penetrating through the surface semiconductor layer 16, the etch stop semiconductor layer 14 and the intermediate semiconductor layer 12 to form a corresponding plurality of stacks thereof, each one of which includes as a successively layered structure an intermediate semiconductor layer 12', an etch stop semiconductor layer 14' and a surface semiconductor layer 16'.

The isolation regions 18 may be formed using methods and materials that are otherwise generally conventional in the semiconductor fabrication art. Thus, to fabricate the semiconductor structure whose schematic cross-sectional diagram is illustrated in FIG. 2 from the semiconductor structure whose schematic cross-sectional diagram is illustrated in FIG. 1, the surface semiconductor layer 16, the etch stop semiconductor layer 14 and the intermediate semiconductor layer 12 that are illustrated in FIG. 1 are first patterned to form the individual stacks that include the intermediate semiconductor layer 12', the etch stop semiconductor layer 14' and the surface semiconductor layer 16'. The individual stacks are, incident to such etching, separated by a plurality of isolation trench apertures that expose the buried dielectric layer 11. The isolation regions 18 may then be formed and planarized into the isolation trench apertures.

The isolation regions 18 may comprise dielectric materials including but not limited to oxides, nitrides and oxynitrides of silicon, although oxides, nitrides and oxynitrides of other elements are not excluded. The isolation regions 18 may be formed using any of several methods. Included in particular are thermal or plasma oxidation or nitridation methods, chemical vapor deposition methods and physical vapor deposition methods. Typically, the isolation regions 18 are formed using a thermal or plasma oxidation or nitridation method to form a liner layer within each particular isolation trench aperture. The resulting lined isolation trench apertures are then backfilled with a deposited dielectric material and planarized using a planarizing method, such as but not limited to a mechanical planarizing method or a chemical mechanical polish planarizing method.

For subsequent reference purposes, FIG. 2 also defines a first region R1 of the CMOS semiconductor structure of FIG. 2 and a plurality of second regions R2 of the CMOS semiconductor structure of FIG. 2. While by no means limiting the embodiment or the invention, the first region R1 is intended to include semiconductor layers that are appropriately doped for fabrication of pFET devices, while the second regions R2 are intended to include semiconductor layers that are appropriately doped for fabrication of nFET devices.

FIG. 3 shows a pad dielectric 20 located and formed upon the semiconductor structure of FIG. 2, including the surface semiconductor layers 16' and the isolation regions 18. FIG. 3 also shows a hard mask 22 located and formed upon the pad dielectric 20. FIG. 3 finally shows a first resist layer 24 located and formed upon the hard mask 22, where the first resist layer 24 leaves uncovered portions of the semiconductor layered stacks in the pFET region R1, but completely covers the semiconductor layered stacks in the nFET regions R2, as illustrated in FIG. 2.

The pad dielectric 20 may comprise any of several dielectric materials that are otherwise generally conventional in the semiconductor fabrication art. Oxides, nitrides and oxynitrides of silicon provide generally conventional pad dielectric materials. Oxides, nitrides and oxynitrides of other elements are not excluded. Typically, for optimal stress moderation between the hard mask 22 and the surface semiconductor layers 16', the pad dielectric 20 comprises an oxide of the semiconductor material from which is comprised the surface semiconductor layers 16'. Thus, the pad dielectric 20 typically comprises a silicon oxide material, although the embodiment and the invention are not intended to be so limited. Typically, the pad dielectric 20 has a thickness from about 3 to about 15 nanometers.

The hard mask 22 may similarly also comprise any of several hard mask materials. Such hard mask materials may include, but are not necessarily limited to, silicon oxide, silicon nitride and silicon oxynitride hard mask materials. Oxides, nitrides and oxynitrides of other elements are also not excluded as hard mask materials. To provide superior etch selectivity, the hard mask layer 22 typically comprises a nitride hard mask material, such as but not limited to a silicon nitride hard mask material or a silicon oxynitride hard mask material, that is formed to a thickness from about 50 to about 100 nanometers.

As is understood by a person skilled in the art, each of the pad dielectric 20 and the hard mask 22 may be formed using methods that are, within the context of some limitations, generally analogous, equivalent or identical to the methods that are used for forming the buried dielectric layer 11 and the isolation regions 18. Of that group of methods, chemical vapor deposition methods are generally more common, but by no means limit the invention.

The resist layer 24 may comprise any of several resist materials that are generally photoresist materials, although other resist materials, such as electron beam resist materials, are not excluded within the embodiment or the invention. Suitable candidate resist materials include positive resist materials, negative resist materials and hybrid resist materials that include characteristics of positive resist materials and negative resist materials. Typically, the resist layers 24 comprises a positive resist material or a negative resist material that has a thickness from about 200 to about 500 nanometers, and that leaves uncovered approximately on half of a surface area of each of the surface semiconductor layers 16' within the pFET region R1.

FIG. 4 first shows the results of etching the hard mask 22 to form a hard mask 22', while using the resist layer 24 as an etch mask. The hard mask 22 may be etched to provide the hard mask 22' while using the resist layer 24 as an etch mask, and while using etch methods and etch materials that are otherwise generally conventional in the semiconductor fabrication art. Candidate etch methods generally include, but are not necessarily limited to, wet chemical etch methods, dry plasma etch methods and combinations of wet chemical etch methods and dry plasma etch methods. Typically, the hard mask 22 is etched to form the hard mask 22' while using a plasma etch method that uses an appropriate etchant gas composition and etching parameters that provide nominally straight sidewalls to the hard mask 22'. As is illustrated within the schematic cross-sectional diagram of FIG. 4, the hard mask 22' leaves uncovered central portions of the central two surface semiconductor layers 16' that are included within the pFET region R1, as defined in FIG. 2.

FIG. 4 also shows the results of stripping the resist layers 24 from the hard mask 22', after patterning the hard mask 22 to form the hard mask 22'. The resist layers 24 may be stripped using methods and materials that are otherwise generally conventional in the semiconductor fabrication art. Included in particular, but also not limiting, are wet chemical etch methods, dry plasma etch methods and combinations of wet chemical etch methods and dry plasma etch methods.

FIG. 5 first shows the results of etching the pad dielectric 20 to form a pad dielectric 20' while using the hard mask 22' as an etch mask. Similarly with the etching of the hard mask 22 to form the hard mask 22', the pad dielectric 20 may be etched to form the pad dielectric 20' while using methods and materials that are otherwise generally conventional in the semiconductor fabrication art. Included in particular, but also not limiting, are wet chemical etch methods, dry plasma etch methods and combinations of wet chemical etch methods and dry plasma etch methods.

FIG. 5 also shows the results of etching the central two surface semiconductor layers 16' that are illustrated in FIG. 4 to form a plurality of surface semiconductor layers 16" and a plurality of residue layers 16''', while using the hard mask 22' and the pad dielectric 20' as an etch mask, and while also using the etch stop semiconductor layers 14' as etch stop layers. Finally, incident to such etching, the central isolation region 18 that is illustrated in FIG. 4 is also etched to form an isolation region 18'. As is illustrated in FIG. 5, the foregoing etching provides an aperture A that exposes the etch stop semiconductor layers 14' within the pFET region R1.

As is illustrated within the schematic cross-sectional diagram of FIG. 5, the foregoing etching of the surface semiconductor layers 16' to form the surface semiconductor layers 16" within the pFET region R1 is intended as a crystallographically directionally specific etch that provides, when the surface semiconductor layers 16' have a (100) surface (i.e., plateau) crystallographic orientation, that the surface semiconductor layers 16" have: (1) a horizontal plateau H portion that has the (100) surface crystallographic orientation; and (2) a contiguous adjacent and adjoining sloped incline I portion that has a (111) surface crystallographic orientation or alternatively a (110) crystallographic orientation.

The foregoing crystallographically directionally specific etching that may be used to form the surface semiconductor layers 16" from the central two surface semiconductor layers 16' may be effected using directionally specific etching methods and directionally specific etching materials that are otherwise generally conventional in the semiconductor fabrication art. In particular, desirable directionally specific etching materials include aqueous potassium hydroxide materials and aqueous tetramethylammonium hydroxide materials. In particular, an aqueous potassium hydroxide etchant at a concentration from about 20 to about 40 weight percent, and at a temperature from about 60 to about 100 degrees centigrade, will typically etch a silicon semiconductor material (i.e., the surface semiconductor layers 16' when comprising a silicon semiconductor material) in comparison with a silicon-germanium alloy semiconductor material (i.e., the etch stop semiconductor layers 14' when comprising a silicon-germanium alloy semiconductor material) having about 20 atomic percent germanium at a selectivity ratio of about 20:1.

FIG. 6 shows a second resist layer 26 located and formed upon the semiconductor structure of FIG. 5 and filling the aperture A within the semiconductor structure of FIG. 5 while bridging to leave uncovered outer portions (i.e., approximately one-half uncovered) of the outer two surface semiconductor layers 16' that are located within the nFET regions R2 as defined in FIG. 2. This second resist layer 26 may comprise resist materials, have thickness dimensions and be formed using methods analogous, equivalent or identical to the materials, dimensions and methods used for forming the first resist layer 24 that is illustrated in FIG. 3.

FIG. 7 shows the results of etching and patterning the hard mask 22' and the pad dielectric 20' to form a hard mask 22'' and a pad dielectric 20'' while using the second resist layer 26 as an etch mask layer and the surface semiconductor layers 16' as etch stop layers. The foregoing etching is otherwise generally analogous, equivalent or identical to the etching that is used to provide the pad dielectric 20' that is illustrated in FIG. 5 from the pad dielectric 20 that is illustrated in FIG. 4 or the hard mask 22' that is illustrated in FIG. 4 from the hard mask 22 that is illustrated in FIG. 3. As is illustrated within the schematic cross-sectional diagram of FIG. 7, and in accordance with discussion above with respect to the second resist layer 26, the hard mask 22'' and the pad dielectric 20' covers over approximately one-half the surface portions of the surface semiconductor layers 16' within the nFET regions R2 and approximately an adjacent one-half the surface portions (i.e., the complete horizontal surface portions) of the surface semiconductor layers 16".

Figure 8:
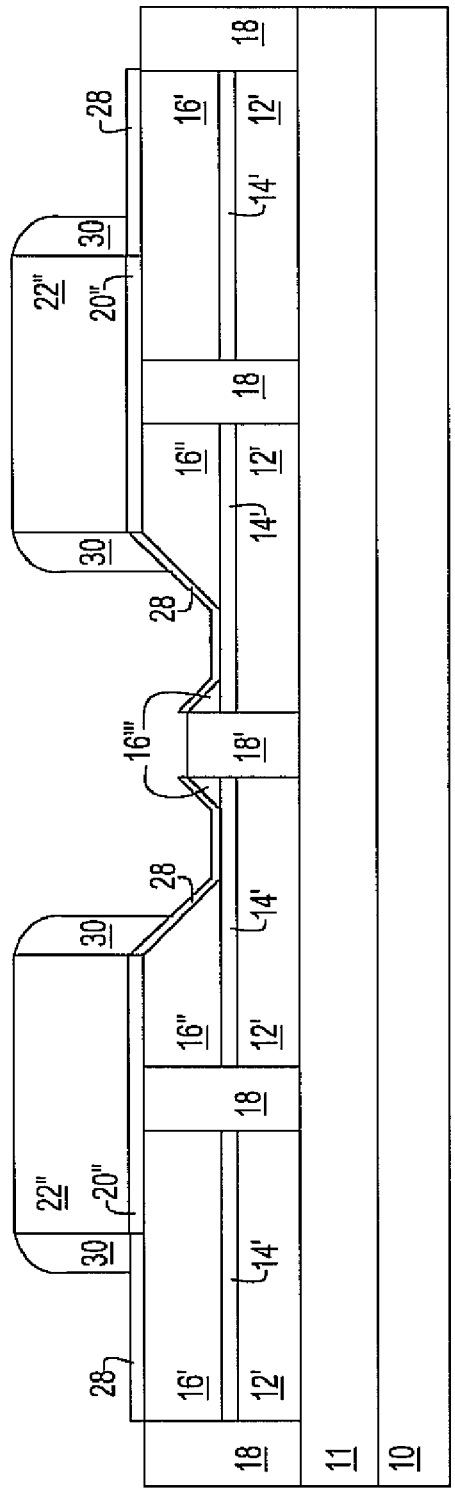

FIG. 8 first shows the results of stripping the second resist layer 26 from the semiconductor structure of FIG. 7 after having etched the hard mask 22' to form the hard mask 22'' and the pad dielectric 20' to form the pad dielectric 20''. The second resist layer 26 that is illustrated within the semiconductor structure of FIG. 7 may be stripped to provide in part the semiconductor structure of FIG. 8 while using resist stripping methods and materials that are analogous, equivalent or identical to the resist stripping methods and materials that are used for stripping the first resist layer 24 from the semiconductor structure of FIG. 3 to provide in part the semiconductor structure of FIG. 4.

FIG. 8 also shows a plurality of gate dielectrics 28 located and formed upon exposed portions of the surface semiconductor layers 16' (which serve as nFET active regions), the surface semiconductor layers 16" (which serve in part as pFET active regions), the residue layers 16''' and the etch stop semiconductor layers 14'.

The gate dielectrics 28 may comprise conventional dielectric materials such as but not limited to oxides, nitrides and oxynitrides of silicon that have a dielectric constant from about 4 to about 20, measured in vacuum. Alternatively, the gate dielectrics 28 may comprise generally higher dielectric constant dielectric materials having a dielectric constant from about 20 to at least about 100. Such higher dielectric constant dielectric materials may include, but are not limited to hafnium oxides, hafnium silicates, titanium oxides, barium-strontium-titantates (BSTs) and lead-zirconate-titanates (PZTs). The gate dielectrics 16 may be formed using any of several methods that are appropriate to their materials of composition. Included, but not limiting, are thermal or plasma oxidation or nitridation methods (i.e., that provide the plural and discrete gate dielectrics 28 that are illustrated in FIG. 8), as well as chemical vapor deposition methods and physical vapor deposition methods (i.e., that would provide a blanket gate dielectric that would further cover exposed sidewall and top surfaces of the hard masks 22"). Typically, the gate dielectrics 28 comprise a thermal silicon oxide dielectric material that has a thickness from about 0.7 to about 2 nanometers.

FIG. 8 finally also shows a plurality of gate electrodes 30 located and formed upon portions of the gate dielectrics 28 which adjoin the hard masks 22". The plurality of gate electrodes 30 may comprise materials including, but not limited to certain metals, metal alloys, metal nitrides and metal silicides, as well as laminates thereof and composites thereof. The plurality of gate electrodes 30 may also comprise doped polysilicon and doped polysilicon-germanium alloy materials (i.e., having a dopant concentration from about 1e18 to about 1e22 dopant atoms per cubic centimeter) and polycide materials (doped polysilicon (or polysilicon-germanium alloy)/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate electrodes 30 comprise a doped polysilicon material originally deposited to a thickness from about 20 to about 40 nanometers, and then anisotropically etched to provide the plurality of spacer shaped gate electrodes 30. The invention is not, however, limited to gate electrodes that only comprise the foregoing material.

Figure 9:
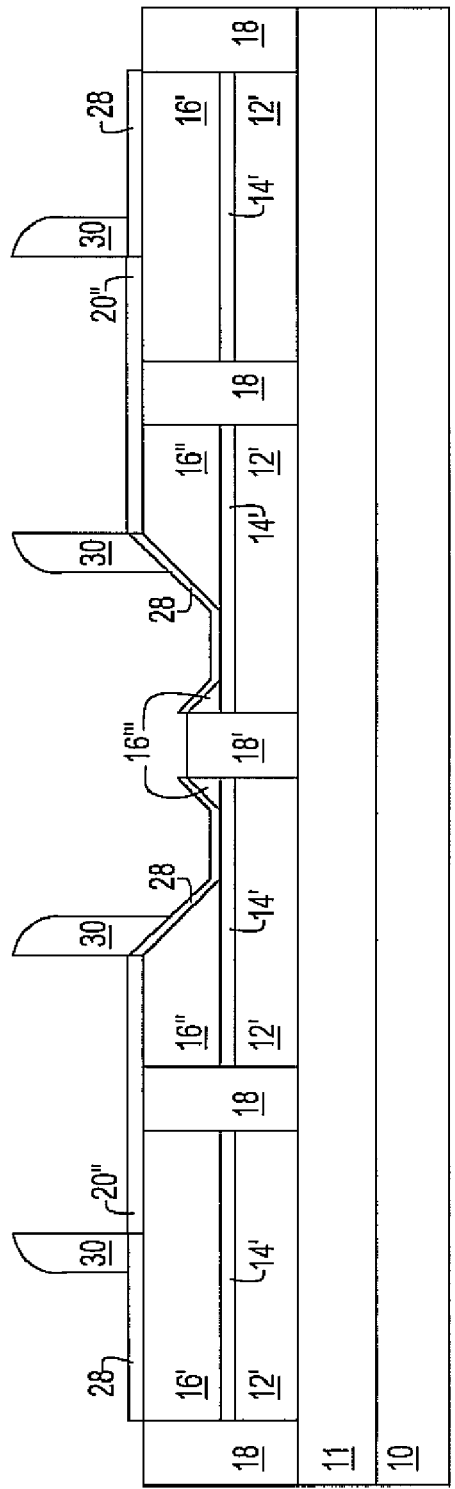

FIG. 9 shows the results of stripping the hard masks 22" from the semiconductor structure of FIG. 8. The hard masks 22" may be stripped using methods and materials that are otherwise generally conventional in the semiconductor fabrication art. Included in particular are wet chemical stripping methods, dry plasma striping methods and combinations of wet chemical stripping methods and dry plasma stripping methods. When the hard masks 22" comprise a silicon nitride material as is desirable within the preferred embodiment, the hard masks 22" may be stripped using a plasma etch method that has a specificity for silicon nitride in comparison with surrounding materials. In an alternative, the hard masks 22" may be stripped using an aqueous phosphoric acid solution at elevated temperature. Alternative methods, or combinations of methods, may also be used.

Figure 10:
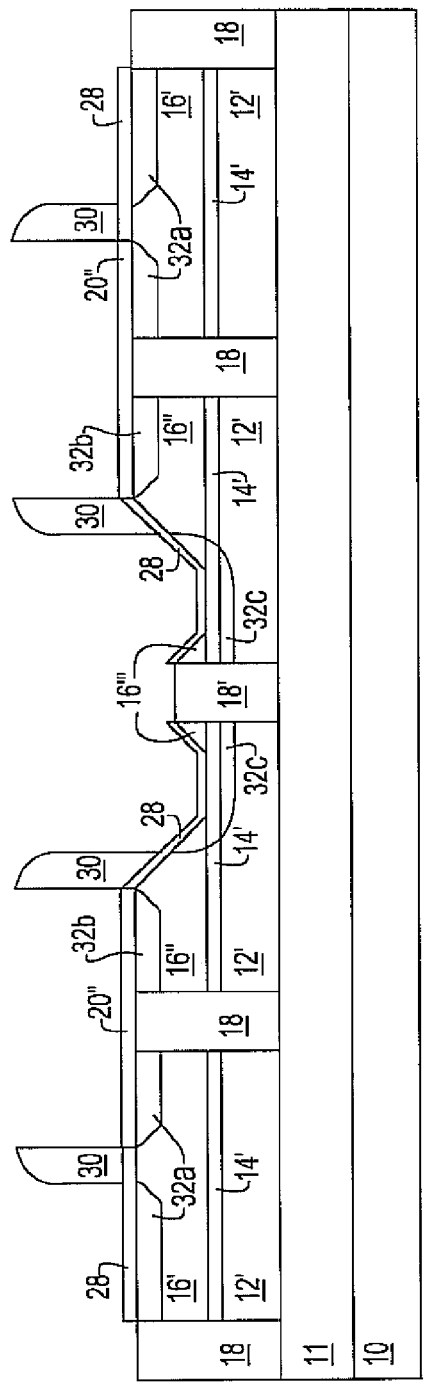

FIG. 10 shows the results of implanting: (1) a plurality of symmetric extension regions 32a into the surface semiconductor layers 16' within the nFET region R2 while using the outer lying gate electrodes 30 as a mask; (2) a plurality of asymmetric extension regions paired as 32b and 32c into, respectively, the horizontal portion and the sloped incline portion of the surface semiconductor layers 16" (and for the extension regions 32c also the etch stop semiconductor layers 14' and the intermediate semiconductor layers 12') while using the central lying gate electrodes 30 as a mask.

The extension regions 32a, 32b and 32c may be formed using ion implantation methods and materials that are generally conventional in the semiconductor fabrication art. Such ion implantation methods will typically use a dopant of an appropriate polarity implanted into the surface semiconductor layers 16' within the nFET region R2 or into the surface semiconductor layers 16", the etch stop semiconductor layers 14' and the intermediate semiconductor layers 12' within the pFET regions R1 at an ion implantation dose from about $1 \times 10^{14}$ to about $2 \times 10^{15}$ dopant ions per square centimeter and an ion implantation energy from about 0.5 to about 10 keV.

Figure 11:
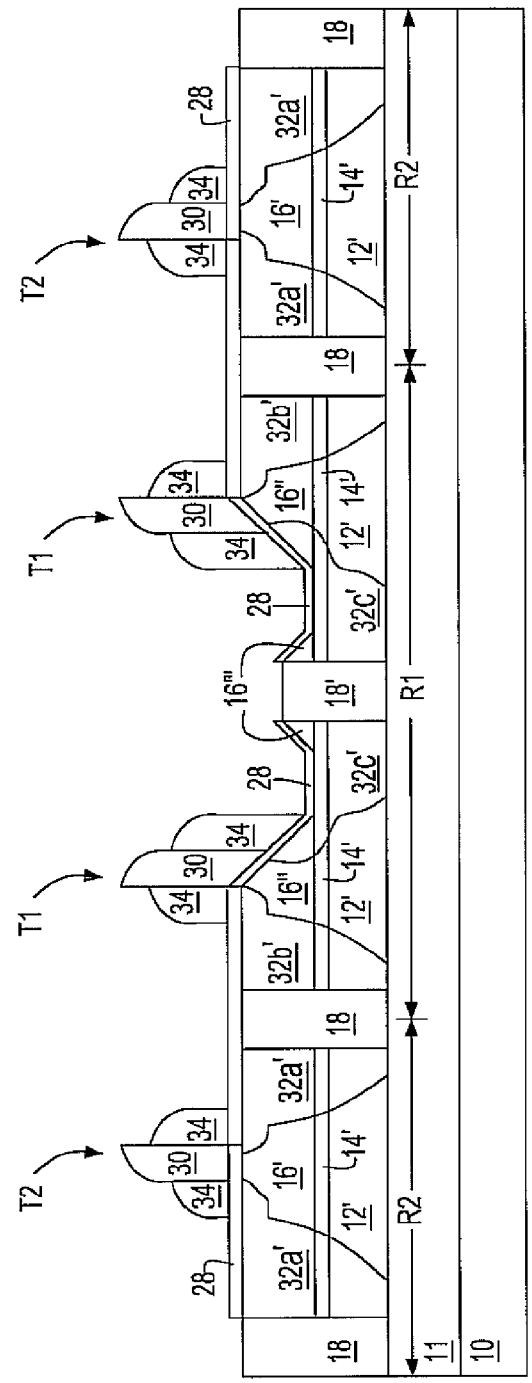

FIG. 11 first shows a plurality of spacers 34 located adjacent and adjoining the plurality of gate electrodes 30. The plurality of spacers 34 may comprise dielectric spacer materials as well as conductor spacer materials, although dielectric spacer materials are more common. Multilayer spacers including in particular multilayer dielectric spacers are particularly common. Dielectric materials from which are comprised dielectric spacers may be formed using methods analogous, equivalent or identical to the methods used for forming the dielectric materials from which are comprised the isolation regions 18. Typically, the plurality of spacers 34 is formed using a blanket layer deposition and anisotropic etch-back method that provides the plurality of spacers 34 with the characteristic inward pointed shape.

Finally, FIG. 11 also shows a plurality of source and drain regions 32a', 32b' and 32c' that result from further implanting the corresponding extension regions 32a, 32b and 32c while simultaneously using the gate electrodes 30 and the spacers 34 as a mask. The foregoing further implanting of the extension regions 32a, 32b and 32c to provide the source and drain regions 32a', 32b' and 32c' is undertaken using a dopant of an appropriate polarity, and at an ion implantation dose from about $1 \times 10^{15}$ to about $5 \times 10^{15}$ dopant ions per square centimeter and an ion implantation energy from about 2 to about 20 keV.

FIG. 11 shows a schematic cross-sectional diagram of a CMOS semiconductor structure in accordance with a preferred embodiment of the invention. The CMOS semiconductor structure includes pFET transistors T1 located and formed within pFET region R1 of the CMOS semiconductor structure. The CMOS semiconductor structure also includes nFET transistors T2 located and formed within nFET regions R2 of the CMOS semiconductor structure. Within the CMOS semiconductor structure, the channel regions of the pFET transistors T1 are located upon a different crystallographic orientation semiconductor material than the channel regions of the nFET transistors T2. In addition, the pFET transistors T1 have asymmetric source and drain regions 32b' and 32c', while the nFET transistors T2 have symmetric source and drain regions 32a'. By optimization of the source and drain region asymmetry of the pFET transistors T1 in comparison with the nFET transistors T2, and by also using different crystallographic orientations for the pFET transistors T1 and the nFET transistors T2, performance of the pFET transistors T1 and the nFET transistors T2 within the CMOS semiconductor structure of FIG. 11 may be optimized. In particular, when the source and drain regions 32c' comprise drain regions that are asymmetrically smaller, the pFET transistors T1 are provided with reduced drain overlap capacitance, and pFET transistor performance enhancements that may relate to improvements in short channel effect performance. In addition, when the source and drain regions 32b' comprise source regions that are asymmetrically larger, the pFET transistors T1 are provided with reduced source resistance or with enhancement of pFET performance.

While FIG. 11 illustrates the invention preferably within the context of a CMOS semiconductor structure that includes a pFET with asymmetrically larger source regions 32b' and drain regions 32c', and an nFET with symmetric source and drain regions 32a, the embodiment and the invention are not necessarily so limited. Rather, the invention also contemplates that within the context of appropriate design considerations and performance requirements an nFET may be desirably designed with asymmetric source and drain regions, or that a pFET may under appropriate circumstances include an asymmetrically larger drain region and smaller source region.

The preferred embodiment of the invention is illustrative of the invention rather than limiting of the invention. Revisions and modification may be made to methods materials structures and dimension of a CMOS semiconductor structure in accordance with the preferred embodiment while still providing a semiconductor structure and a method for fabricating the semiconductor structure in accordance with the invention, further in accordance with the accompanying claims.

What is claimed is:

1. A semiconductor structure comprising:
    a semiconductor substrate that includes an active region comprising:
        a horizontal plateau having a first crystallographic orientation; and
        a contiguous and adjoining sloped incline having a second crystallographic orientation different than the first crystallographic orientation;
    a gate electrode located over a channel within the sloped incline, wherein said gate electrode includes a first substantially straight sidewall edge located at a first point intersecting the horizontal plateau and the sloped incline and a second substantially straight sidewall edge located at a second point on the inclined slope, said second point not going beyond the lowest portion of said inclined slope, and wherein said first substantially straight sidewall edge and said second substantially straight sidewall edge are connected by an upper wall that curves outward from said first substantially straight sidewall edge to said second substantially straight sidewall edge; and
    a plurality of source and drain regions located within the active region and separated by the channel, where the plurality of source and drain regions is asymmetric and wherein the channel within the sloped incline is located at a juncture with the horizontal plateau.

2. The semiconductor structure of claim 1 wherein:
    one of the plurality of source and drain regions is located at least in part within the horizontal plateau; and
    another of the plurality of source and drain regions is located at least in part within the sloped incline.

3. The semiconductor structure of claim 1 wherein the semiconductor substrate comprises a semiconductor-on-insulator substrate.

4. The semiconductor structure of claim 1 wherein the semiconductor substrate comprises a bulk semiconductor substrate.

5. The semiconductor structure of claim 1 wherein:
    the first crystallographic orientation is a (100) crystallographic orientation; and
    the second crystallographic orientation is one of a (111) crystallographic orientation and a (110) crystallographic orientation.

6. The semiconductor structure of claim 5 wherein the semiconductor structure comprises a pFET wherein:
    a source region is located at least in part within the horizontal plateau; and
    a drain region is located at least in part within the sloped incline.

7. A semiconductor structure comprising:
    a semiconductor substrate that comprises:
        a first active region comprising:
            a horizontal plateau having a first crystallographic orientation; and
            a contiguous and adjoining sloped incline having a second crystallographic orientation different than the first crystallographic orientation; and
        a second active region having a horizontal plateau having the first crystallographic orientation;
    a first gate electrode located over a first channel within the sloped incline within the first active region and a second gate electrode located over a second channel within the horizontal plateau within the second active region, wherein said first gate electrode includes a first substantially straight sidewall edge located at a first point intersecting the horizontal plateau and the sloped incline and a second substantially straight sidewall edge located at a second point on the inclined slope, said second point not going beyond the lowest portion of said inclined slope, and wherein said first substantially straight sidewall edge and said second substantially straight sidewall edge are connected by an upper wall that curves outward from said first substantially straight sidewall edge to said second substantially straight sidewall edge;
    a plurality of first source and drain regions located within the first active region and separated by the first channel, where the plurality of first source and drain regions is asymmetric, and
    a plurality of second source and drain regions located within the second active region and separated by the second channel, where the plurality of second source and drain regions is symmetric and wherein the first channel within the sloped incline is located at a juncture with the horizontal plateau.

8. The semiconductor structure of claim 7 wherein:
    one of the plurality of first source and drain mien regions is located at least in part within the horizontal plateau; and
    another of the plurality of first source and drain regions is located at least in part within the sloped incline.

9. The semiconductor structure of claim 7 wherein the semiconductor substrate comprises a semiconductor-on-insulator substrate.

10. The semiconductor structure of claim 7 wherein the semiconductor substrate comprises a bulk semiconductor substrate.

11. The semiconductor structure of claim 7 wherein:
    the first crystallographic orientation is a (100) crystallographic orientation; and
    the second crystallographic orientation is at least one of a (111) crystallographic orientation and a (110) crystallographic orientation.

12. The semiconductor structure of claim 11 wherein the first active region includes a pFET wherein:
    an asymmetrically large source region is located at least in part within the horizontal plateau; and
    an asymmetrically small drain region is located at least in part within the sloped incline.

* * * * *